United States Patent [19]
Balzer

[11] Patent Number: 5,552,891
[45] Date of Patent: Sep. 3, 1996

[54] AUTOMATED MASK ALIGNMENT FOR UV PROJECTION EXPOSE SYSTEM

[75] Inventor: Peter L. Balzer, Chenango Forks, N.Y.

[73] Assignee: International Business Machines Corporation, Armonk, N.Y.

[21] Appl. No.: 332,330

[22] Filed: Oct. 31, 1994

[51] Int. Cl.⁶ .................................................. G01B 11/00
[52] U.S. Cl. .......................... 356/400; 356/373; 356/375
[58] Field of Search .................................... 356/373, 375, 356/400; 430/5

[56] References Cited

U.S. PATENT DOCUMENTS

| | | | |
|---|---|---|---|
| 4,652,134 | 3/1987 | Pasch et al. | 356/357 |
| 4,672,209 | 6/1987 | Karasaki et al. | 250/458.1 |
| 4,690,529 | 9/1987 | Sugiyama et al. | 353/122 |
| 4,853,756 | 8/1989 | Matsuki | 355/71 |
| 5,137,363 | 8/1992 | Kosugi et al. | 356/401 |
| 5,268,744 | 12/1993 | Mori et al. | 356/400 |

FOREIGN PATENT DOCUMENTS

| | | |
|---|---|---|
| 63-70421 | 3/1988 | Japan . |
| 4-177822 | 6/1992 | Japan . |
| 5-226220 | 9/1993 | Japan . |

*Primary Examiner*—S. Rosasco
*Attorney, Agent, or Firm*—Pollock, Vande Sande & Priddy

[57] ABSTRACT

An apparatus for aligning an image on a substrate support. A substrate support supports a substrate to be treated by radiation. At least one radiation source produces desired wavelengths of radiation to treat the substrate. The radiation is directed toward the substrate support. At least one filter filters selected wavelengths of the radiation. The filter is positioned between the substrate support and the radiation source. A mask selectively transmits the radiation. The mask is positioned between the radiation source and the substrate support. At least one detector detects a position of radiation impinging upon the substrate support and produces a signal corresponding to the sensed position. The detected position is compared with a desired position of radiation impinging upon the substrate support. The detected position is compared to the desired position and a signal is produced corresponding to the comparison. A positioner positions the substrate support in a desired position for treating the substrate. The positioning means receives the signal from the comparing means and alters, when necessary, in a direction parallel to a surface of a substrate supported by the substrate support, the position of the substrate support and the radiation source, mask, and filter relative to each other in accordance with the signal so that the sensed position corresponds to the desired position.

11 Claims, 2 Drawing Sheets

AUTOMATED MASK ALIGNMENT FOR UV PROJECTION EXPOSE SYSTEM

FIELD OF THE INVENTION

The invention relates to an apparatus and a method for positioning a radiation source, a mask, and a support for a substrate to be treated by radiation produced by the radiation source in a desired position relative to each other. The invention also relates to a method of treating a substrate with radiation.

BACKGROUND OF THE INVENTION

Circuit boards, circuit cards and other electronic devices are manufactured using photolithographic techniques. In producing such devices, typically, at least one layer of a photosensitive material, typically known as a photoresist, is deposited on a substrate. The photosensitive material may then be patterned by exposing it to radiation of certain wavelengths to alter characteristics of the photosensitive material. Typically, the radiation is from the ultraviolet range of wavelengths, although other wavelengths may be used. Preferably, the radiation causes desired photochemical reactions to occur within the photosensitive material coated on the substrate.

Typically, a mask is positioned between the radiation source and the substrate so as to selectively block portions of the radiation emanating from the radiation source, thereby forming a pattern of exposure in the photosensitive material. Preferably, the photochemical reactions alter the solubility characteristics of the photoresist, thereby allowing the removal of certain portions of the photoresist. Selectively removing certain parts of the photoresist allows for the protection of certain areas of the substrate while exposing other areas.

After exposure to radiation, the photoreactive material is then developed in a developer so as to remove either the exposed or unexposed portions of the photoreactive compound, depending upon its nature. After removing portions of the photoreactive compound, the underlying substrate may be processed. According to one method, the substrate is processed by allowing the diffusion of desired impurities through the openings in the photosensitive material into the substrate. Other processes are also known for forming devices of a substrate.

When creating electronic devices as described above, the radiation source, mask, and substrate must be positioned relative to each other to ensure that the pattern of exposure of the photoreactive compound on the substrate is formed in a desired location. Often, the radiation used to form the pattern in the ultraviolet and/or near ultraviolet range of the electromagnetic spectrum. Such wavelengths are not visible or not readily visible to the human eye. Therefore, aligning the radiation source, mask, and substrate relative to each other is often times difficult or impossible.

Although correctly aligning the substrate, mask, and radiation source is always important, it is even more important in producing large circuit boards, circuit cards, and other large devices. Often, large circuit boards, circuit cards and other devices require two passes of the light source and mask over the substrate to expose the entire area of the substrate. In such cases, alignment is even more critical then in cases where only one pass is required to form a pattern over the entire substrate. In other applications, a substrate may need to be realigned with respect to a radiation source on a mask for other purposes, such as to re-expose the substrate to a different pattern of radiation. In any of these applications, it is very important that the substrate mask and radiation source be correctly positioned so as to result in the formation of the correct pattern in the correct position in the photosensitive material on the substrate.

Alignment of the substrate, mask and radiation source typically has been performed mechanically. Such mechanical methods may be imprecise, thereby resulting in lower accuracy and lower yields. Mechanical aligning techniques may include alignment marks formed on the substrate and/or a substrate support for determining the position of the substrate and/or radiation projected on the photosensitive material on the substrate.

Other methods are at least partially electronic. For instance, cameras or other light detectors may be used to sense the position of the radiation impacting upon photosensitive material on the substrate. Other sensors may also be used to detect the radiation. Electronic sensing techniques also may include alignment marks formed on the substrate and/or a substrate support for determining the position of the radiation projected on the photosensitive material on the substrate. Regardless of what type of sensor or detector is used, if such sensors do not detect ultraviolet or near ultraviolet or wavelengths of radiation, they will be useless.

It was particularly in response to the inability of optical detectors to detect the position of a substrate relative to a projected pattern of ultraviolet and/or near ultraviolet radiation that the present invention was developed.

SUMMARY OF THE INVENTION

Accordingly, it is an object of the present invention to provide an apparatus and a method for aligning a radiation source, a mask and a substrate support.

It is also an object of the present invention to provide a method of treating a substrate with radiation.

Another object of the present invention is to provide an apparatus and a method for aligning a radiation source producing irradiation not visible to the human eye relative to a mask in a substrate to be treated by the radiation.

An advantage of the present invention is to eliminate the need for scrape set-up pieces.

An additional advantage of the present invention is to provide greater alignment accuracy over mechanical alignment methods.

A further advantage of the present invention is to improve yields of UV photoresist exposure methods.

An additional further advantage of the present invention is to provide an accurate mask alignment apparatus and method for projection exposure systems utilizing ultraviolet and/or near ultraviolet radiation to expose photoresist.

According to preferred aspects, the present invention provides an apparatus for aligning an image on a substrate support. The apparatus includes a substrate support for supporting a substrate to be treated by radiation. At least one radiation source produces desired wavelengths of radiation to treat the substrate. The radiation is directed toward the substrate support.

At least one filter filters out selected wavelengths of the radiation. The filter is positioned between the substrate support and the radiation source. A mask selectively transmits the radiation. The mask is also positioned between the radiation source and the substrate support.

At least one detector detects radiation impinging upon the substrate support and produces a signal corresponding to the sensed position. A positioner positions the substrate support in a desired position for treating the substrate. The positioner receives the signal from the at least one detector, determines whether a deviation exists between the sensed position and the desired position, and alters, when necessary, the position of the substrate support and the radiation source, mask, and filter relative to each other so that the sensed position corresponds to the desired position.

According to other preferred aspects, the present invention provides a method of aligning an image at a desired position on a substrate support. The method includes the step of providing a radiation source producing desired wavelengths of radiation. The radiation is directed toward a substrate support.

At least one filter is positioned between the radiation source and the substrate. A mask is also positioned between the radiation source and the substrate. The mask selectively transmits the radiation.

The substrate support is irradiated with the radiation. A position of the radiation impacting upon the substrate support is determined with at least one detector. The existence of a deviation of position of the radiation on the substrate support away from a desired position is determined. If a deviation exists, the position of the radiation source, the mask and the substrate support relative to each other is altered so as to cause the position of the radiation on the substrate support to substantially correspond to the desired position.

According to further preferred aspects, the present invention provides a method of treating a substrate with radiation. The method includes the step of providing a radiation source producing desired wavelengths of radiation. The radiation is directed toward a substrate support.

At least one filter is positioned between the radiation source and the substrate. A mask is also positioned between the radiation source and the substrate. The mask selectively transmits the radiation.

The substrate support is irradiated with the radiation. A position of the radiation impacting upon the substrate support is determined with at least one detector. The existence of a deviation of position of the radiation on the substrate support away from a desired position is determined. If a deviation exists, the position of the radiation source, the mask and the substrate support relative to each other is altered so as to cause the position of the radiation on the substrate support to substantially correspond to the desired position.

A substrate is then positioned on the substrate support and irradiated with the radiation.

Still other objects and advantages of the present invention will become readily apparent to those skilled in this art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications and various obvious respects without departing from the invention. Accordingly, the drawings and description are to be regarded as illustrative in nature and not as restrictive.

DETAILED DESCRIPTION OF VARIOUS AND PREFERRED EMBODIMENTS

Figure 1:
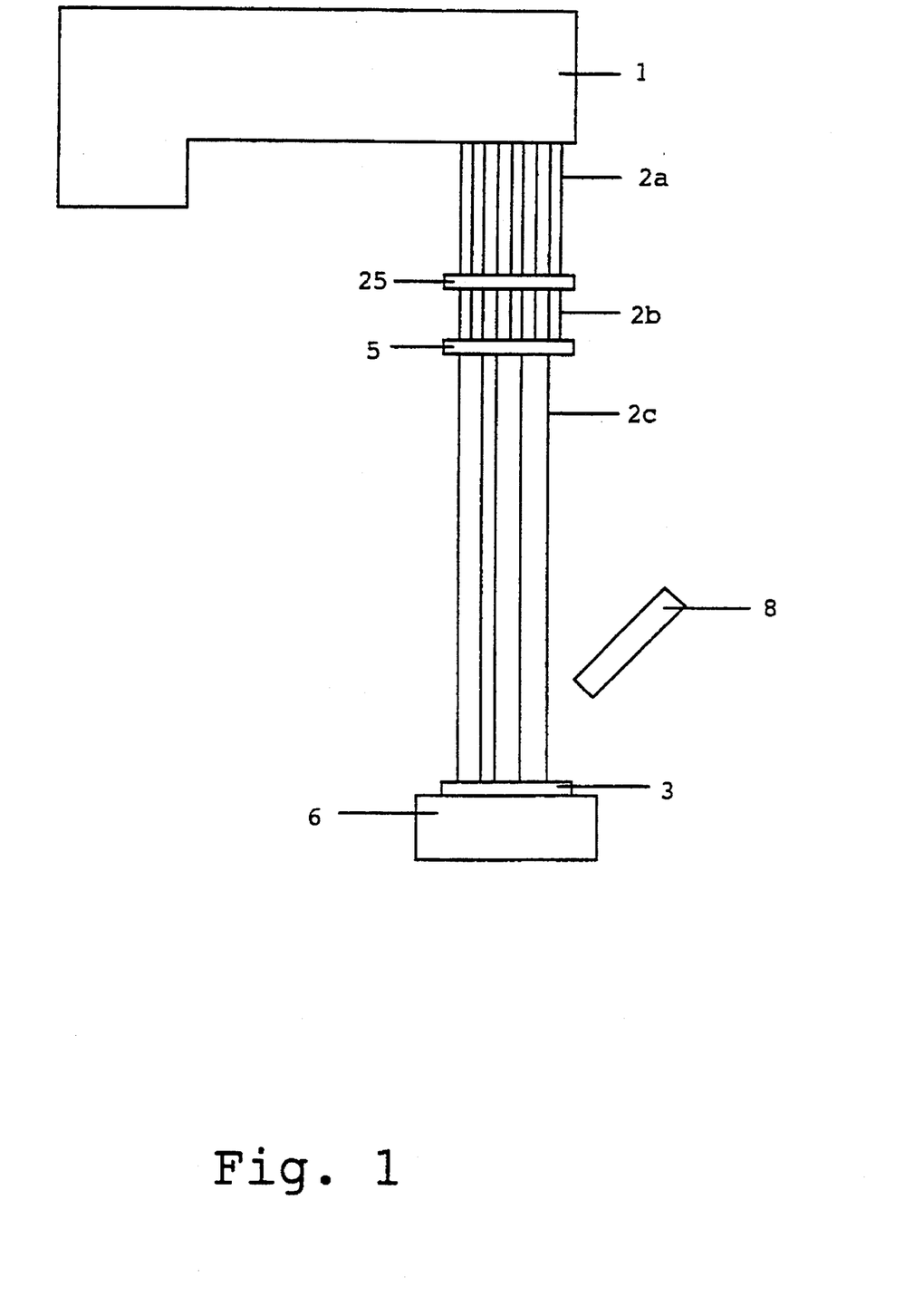
FIG. 1 represents a schematic view of an embodiment of an apparatus according to the present invention for aligning a radiation source, a mask, and a substrate support.

FIG. 1 shows one embodiment of an apparatus according to the present invention for aligning a mask with a substrate support. The substrate support supports a substrate while the substrate is treated by radiation produced by a radiation source. The radiation is first transmitted through a mask.

The embodiment shown in FIG. 1 includes a radiation source 1. The radiation produced by the radiation source 1 may be directly aimed at a substrate support 3 as in the embodiment shown in FIG. 1. Alternatively, one or more reflecting members, such as mirrors, may be placed between the radiation source 1 and the substrate support 3 to direct the radiation produced by the radiation source to the substrate support.

The radiation 2a produced by the radiation source may be of any wavelength to result in the photochemical reactions taking place in the photosensitive material applied to a substrate 4 supported by the substrate support 3. Typically, radiation in the ultraviolet and/or near ultraviolet range is used to expose photoresists typically employed in forming electronic devices. However, any wavelength of radiation which results in the desired photochemical reactions taking place in the photosensitive material on the substrate 4 may be produced by the radiation source 1.

In a typical embodiment of the present invention, a radiation source is used which produces ultraviolet radiation of about 365 nm. The radiation source may also produce radiation of other wavelengths including visible light simultaneously with the ultraviolet radiation. Examples of radiation sources which may be used with the present invention include mercury and xenon-mercury arc lamps. Such lamps are available from Hanova, ORC and ARC. However, any radiation source may be employed which produces a spectrum of wavelengths and range of power output which are sufficient to cause the desired reaction in the photosensitive material applied to the substrate. One skilled in the art would be able to determine which wavelengths to use and which radiation source would produce the wavelengths.

Typically, an apparatus such as the one shown in FIG. 1 for exposing a photoresist applied to a substrate, a mask 5 is placed between the radiation source 1 and the substrate support 3. Generally, the mask is formed of a material which does not transmit the wavelengths of radiation produced by the radiation source. Examples of materials that may be used to block ultraviolet radiation include chrome and emulsion. Quartz glass is also a typical mask material for projection exposure. However, any material may be used to form the mask to be opaque to the wavelengths of radiation used to expose the photosensitive material. One skilled in the art would be able to easily determine which materials may be used to form the mask based upon the wavelength of radiation used, among other factors.

Portions of the material from which the mask is made are cut-out, thereby allowing the radiation selectively to pass through the mask as shown in FIG. 1. The radiation 2a produced by the radiation source 1 may then pass through the openings (not shown) in the mask to act upon the photoresist coated on the surface of the substrate 3. Portions of the radiation transmitted by the mask are represented in FIG. 1 by 2b.

If the apparatus shown in FIG. 1 is being used to align the radiation source 1, mask 5, and substrate support 3, then after passing through the mask 5, the radiation produced by the radiation source impacts upon the substrate support 3. Alternatively, if the apparatus is being used to treat a substrate, the radiation 2c transmitted by the mask 5 impacts upon the substrate 4 being treated.

In the embodiment shown in FIG. 1, the substrate 4 is supported by a substrate support 3. Preferably, the substrate support 3 is made from a material which does not react when exposed to ultraviolet light. The substrate support 3 is, in turn, supported by means 6 to alter the position of the substrate support. The substrate support 3 may include ridges to surround the substrate 4 to help maintain the substrate stationary on the substrate support while the substrate is being processed. Alternatively, the substrate support 3 may include pins projecting from the surface of the substrate support. The pins may engage passages formed in the substrate. The substrate support 3 may also include any other suitable means for maintaining the substrate 4 in a stationary position while the substrate is being processed by the radiation produced by the radiation source.

According to the present invention, the position of the substrate support 3 relative to the mask 5 and the radiation source 1 may be changed. This allows the present invention, among other things, to be adjusted to treat different size substrates and to treat substrates according to different methods. Regardless of what size substrate is being treated and what method is being employed, the present invention provides an apparatus and method to ensure that the image produced by the radiation passing through the mask and projected on a substrate 4 is properly aligned on the substrate.

In one embodiment of the present invention, the substrate support 3 may be moved while the radiation source 1 and the mask 5 remain stationary. In such an embodiment, the substrate support 3 may include means 6 for altering the position of the substrate support 3. The means 6 for altering the position of the substrate support 3 may include motors to alter the position of the substrate support.

With such an embodiment, the substrate support 3 may be provided with two motors 13 and 15, one to alter the position of the substrate support 3 in one direction perpendicular to the direction of the radiation 2c impacting upon the substrate and a second motor to alter the position of a substrate support 3 in a direction perpendicular to the direction in which the first motor alters the position of the substrate support. Among motors which may be used with the present invention are piezoelectric stepping motors or any other suitable motors. In one embodiment of the present invention, a KLINGER motorized table may be used as a substrate support or to support a substrate support and alter the location of the substrate support relative to the radiation source and the mask. Any other suitable apparatus may also be used to move to substrate support. For instance, any mechanical device, and preferably any mechanical device capable of precisely moving the substrate support, or similar article, in three axes, whether manual or motorized, may be employed with the present invention.

The substrate support 3 may also be moved manually to correctly position it. Such manual moving means may include screws which are turned to alter the position of the substrate support 3.

The invention may also include any suitable means for altering the position of the substrate support relative to the mask and radiation source.

The desired result of moving the substrate support 3 is that the pattern formed by the radiation passing through the mask will illuminate the substrate in the desired position.

An apparatus for automated mask alignment according to the present invention also includes at least one detector or sensor 8 for detecting or sensing radiation 2c impinging upon the substrate support 3. Preferably, prior to the placing the substrate 4 upon the substrate support 3, there must be some certainty that the radiation will strike the desired position on the substrate. Therefore, the substrate support 3 must be aligned prior to placing the substrate 4 on the substrate support. To align the substrate support 3 with the mask 5 and the radiation source 1, according to the present invention, the substrate support will be irradiated by radiation emanating from the radiation source. The at least one sensor or detector 8 detects the position of the radiation upon the substrate support 3.

In one embodiment of the present invention, the sensors used to detect the position of the pattern projected on the substrate support are part of a COGNEX alignment control system, available from the COGNEX company. The COGNEX system may include two television cameras. However, other sensors may also be used to detect the radiation impinging upon the substrate support as long as it does not block the path of the radiation from the radiation source to the substrate support. In one embodiment, at least one LCD miniature camera may be used as the sensor. Such cameras are available from Panasonic. However, any other suitable television camera may also be used. One or more monitors may be used to display what the sensors detect. Other devices may also be used to display the sensed data representing the position of the projected radiation pattern on the substrate support. The monitor(s) may also be made by Panasonic. However, any other monitor may also be used. The system may also include a processor and a controller.

Figure 2:
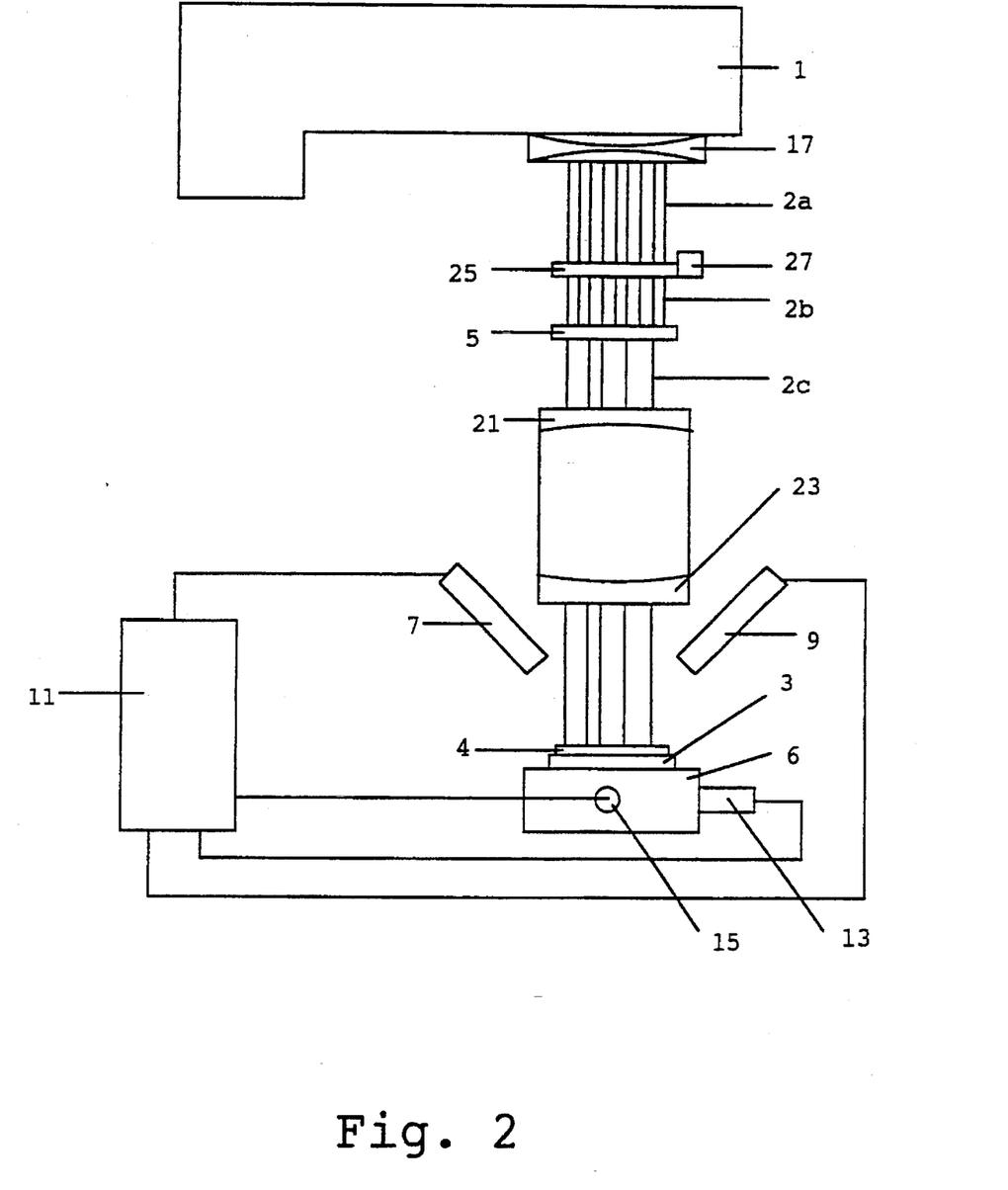
FIG. 2 represents a schematic view of another embodiment of an apparatus according to the present invention for aligning a radiation source, a mask, and a substrate support.

In other embodiments, other types of sensors may be positioned in a similar location to the sensors 7 and 9 shown in FIG. 2. In other embodiments, the sensors may be located on the surface of the substrate. Such sensors detect the radiation as it impacts upon the substrate support 3. Any other type of sensor may be used with the invention and may be positioned in any other location which would allow the position of the radiated pattern to be detected. One skilled in the art would know what type of sensors may be used to perform such a task.

Regardless of what type of system is used, the cameras or other sensors or detectors detect the position of the projected image. The sensors or detectors produce a signal representing the position of the image in the form of an electronic signal. The sensors or detectors preferably are connected to a processor or otherwise transmit the signal representing the position of the irradiated pattern to the processor 11.

A desired position of the image is stored within the processor 11. The processor 11 compares the sensed position of the image projected on the substrate support 3 with the previously entered desired position. The processor 11 then determines the deviation of the sensed position from the desired position. If the desired position corresponds to the sensed position then no movement of the substrate support is required. If, on the other hand, the sensed position deviates from the desired position, the substrate support is moved the required amount to cause the sensed position to correspond to the desired position.

In a typical embodiment, the deviation of the sensed position from the desired position is determined in two different directions such as X and Y axes superposed on the substrate support. The deviation of the sensed position from the desired position is then determined and the substrate support moved a required amount in the direction of each axes. In the embodiment shown in FIG. 2, the COGNEX system processor sends signals to two motors 13 and 15 connected to the substrate support. These two motors then alter the position of the substrate support the required amount in each direction to cause the sensed position to correspond to the desired position.

According to the present invention, one or more lenses 17 may be placed between the radiation source and the substrate support. These lenses may include condenser lenses, projection lenses, and or any other type of lens, alone or in combination with other lenses of the same or other types. The lenses may be placed anywhere along the path of the radiation from the radiation source 1 to the substrate support 3.

In the embodiment shown in FIG. 2, a condenser lens 17 is located between the radiation source 1 and the mask 5. The condenser lens(es) may concentrate the radiation on the mask. The embodiment shown in FIG. 2 also includes a pair of projection lenses 21 and 23 placed in the path of the radiation between the mask 5 and the substrate support 3. The projection lens(es) may focus the radiation passing through the mask on the substrate. However, the invention may include any number of lenses in any combination and in any placement so as to produce a desired effect on the radiation passing between the radiation source and the substrate support. For instance, the lens(es) may be used to focus the light on the substrate is well as on the mask. Lenses may also be used to optimize the performance and focus of the system. For example, it may be necessary to insert lens(es) in the path of the radiation, depending upon the wavelength of radiation used and to adjust the focal point of the radiation.

The present invention may also include at least one filter placed in the path of the radiation anywhere between the radiation o source 1 and the substrate support 3. In the embodiment shown in FIGS. 1 and 2, a filter is positioned between the radiation source and the mask. The embodiment shown in FIG. 2 also includes a lens placed between the filter and the radiation source.

The at least one filter preferably functions to help the present invention align the projected radiation on the substrate support. The wavelengths of radiation typically employed to cause photochemical reactions within the photosensitive materials typically used in electronic devices are from the ultraviolet or near ultraviolet range. Such wavelengths are substantially invisible to sensors used to position the substrate support 3. This is particularly so with the cameras employed in the embodiment shown in FIG. 2.

To overcome the problem of the invisibility of the ultraviolet radiation, the present invention preferably includes a fluorescing medium on the substrate support. The fluorescing medium may be applied directly to the substrate support or, alternatively, may be applied to another member attached to the substrate support. The fluorescing medium preferably fluoresces, producing radiation in the form of visible light when irradiated by ultraviolet light produced by the radiation source.

The fluorescing medium may be sensitive to other wavelengths of radiation. Preferably, the fluorescing medium fluoresces in response to what ever wavelength of radiation is necessary to cause the desired reaction in the photosensitive material applied to the substrate. Those skilled in the art could determine a variety of materials that fluoresce at a desired wavelength. Among the factors considered in selecting a fluorescing medium is the amount of fluorescence produced by the material, or the brightness of the material and whether the medium will produce an amount of fluorescence sufficient to be detected by the sensors. If the fluorescing material produces visible light, the color of the light produced may be a factor in selecting the fluorescing medium. Once aware of this disclosure, one skilled in the art would know how to determine which fluorescing material to use, in what thickness, sensitive to which wavelengths of radiation, and other parameters without undue experimentation.

Accordingly, the present invention preferably includes a filter 25 which may be placed between the radiation source and the substrate support. The filter screens out unwanted wavelengths of radiation, thereby causing the substrate support to be illuminated by the wavelengths causing photochemical reactions in the photosensitive material applied to the substrate. Examples of filters that may be used with the present invention include colored glass. Such filters may be made of glass or any other material, such as plastic. Importantly, the filter must filter the desired wavelengths of radiation. In one embodiment, the filter is selected to filter out as much of the visible light radiation as possible. Typical colored glass filters which may be used according to the present invention include filters known as UG1, UG11, and UG5. Such filters may be available from Schott Optical Glass, Incorporated.

The filter may be supported on a filter support (not shown) which may include a shuttle 27 for altering the position of the filter. A filter 25 in the embodiments shown in FIGS. 1 and 2 is located between the radiation source and the mask. However, the filter 25 may be located anywhere in the path of the radiation between the radiation source and the substrate support. A typical filter is a UG filter. Such a filter is described above. The invention may also include more than one filter to filter out other wavelengths.

In the embodiment shown in FIG. 1, the radiation 2a passes from the radiation source 1 through the filter 25, the wavelengths transmitted by the filter being represented by 2b in FIGS. 1 and 2. Then, the radiation passes through the mask 5 which selectively transmits portions of the radiation as indicated by the lines 2c shown in FIGS. 1 and 2, which extend to the substrate support. The radiation then illuminates the fluorescing medium on the substrate support.

As the radiation acts on the fluorescing medium, the fluorescing medium preferably produces radiation in the visible light wavelengths in response. The visible light produced by the fluorescing medium will be produced in the same pattern as the pattern which will be formed in the photoresist. Since the sensors or detectors that are preferably used with the present invention are sensitive to visible light, the sensors or detectors will detect the visible light generated by the fluorescing medium.

The present invention allows for the detection in visible light of the pattern of radiation formed in another wavelength. This may be necessary because the system may focus radiation of one wavelength or range of wavelengths on the substrate but not in other wavelengths. For instance, in one embodiment, the wavelengths of ultraviolet radiation may be in focus but not the visible wavelengths.

If the sensors or the human eye used to align the substrate support in the proper position is sensitive to wavelengths of visible light radiation, then the substrate support may not be positioned in the proper position. The effect of certain wavelengths being out of focus may be enhanced if the one or more lenses are used to alter the path of the radiation since lenses may alter the path of different wavelengths in a different manner. For instance, the lenses may have different focal points with different wavelengths of radiation.

According to one embodiment of the invention, ultraviolet radiation is used to treat the photosensitive material applied to the substrate. The visible light wavelengths of radiation are not in focus on the substrate support, making alignment of the substrate support difficult at best. Therefore, the fluorescing material is provided to fluoresce in response to the ultraviolet radiation since it is the ultraviolet wavelengths which must be in sharp focus to expose the photosensitive material. The visible light wavelengths are filtered out so as not to interfere with the image produced by the fluorescence and hinder the focusing and aligning. The fluorescing material preferably allows television cameras or other sensors to detect the location of the ultraviolet radiation.

The position of the fluorescing pattern will then be transmitted to a processor 11 which will compare the sensed position to a desired position. Then, if required, the processor will send signals to the means for altering the position of the substrate support. The substrate support will be moved until the sensed position substantially corresponds to the desired position for irradiating the substrate.

The present invention can be adapted for use with other systems which utilize wavelengths of radiation other than ultraviolet to cause photochemical reactions of the photosensitive material on the substrate. In other systems, different filters may be required to filter out other portions of the spectrum of radiation produced by the radiation source. Also, given the different wavelengths, the fluorescing medium used to coat the substrate support or other member attached to the substrate support should be sensitive to the wavelengths of radiation used to treat the photoresist. Other systems using other wavelengths and other filters may still include a radiation source, a filter, a mask, a substrate support and a detector. However, such embodiments may also include one or more lenses for causing various effects to the radiation passing from the radiation source to the substrate support.

The invention is particularly useful with systems used to produce large circuit boards or circuit cards. Treating such large boards or cards typically requires the circuit board or card to be treated by the radiation and then moved for another portion of the board or card treated. Since such cards need to be moved between treatment by the radiation, it is even more important that the substrate be properly aligned as compared to a single pass card. With a single pass card, the circuit board or card is exposed only once and is not moved. One circuit board in which the present invention is especially useful is in the production of a 3.6 inch by 5 inch multi-up card. Such a card may be cut up into smaller pieces for chip placement.

Regardless of the embodiment of the system of the present invention, certain benefits are provided by the present invention. Among the benefits of the present invention are greater accuracy over standard mechanical alignment methods. The greater accuracy is achieved, at least in part, by using sensors to detect the position of the radiation impinging upon the substrate support. The accuracy may be further enhanced by using a processor to determine the deviation from a desired position and also using the processor to position the substrate support in substantially the required position. The present invention also eliminates the need for scrap set-up pieces created in positioning the substrate support, then exposing a photosensitive material on a substrate, inspecting the alignment of the exposure on the substrate, and repeating this procedure until the position of the substrate support is correct. This repetitive process is commonly known as an iterative process. All pieces produced during the process of aligning the substrate support are typically unusable and must be discarded.

By eliminating the need for scrape set-up pieces and providing greater accuracy over standard mechanical alignment methods, the present invention improves the yield of the processes with which it is used. The present invention also does not require iterative set-up procedures such as described above, in which a substrate is exposed, alignment inspected and the substrate support positioned and then the process repeated until the substrate alignment is correct. Further, the present invention is faster than such known mechanical methods and provides superior results with low cost and low set-up. Additionally, precise hardware used in iterative processes is also not required. Benefits other than those specifically listed here are also achieved by the present invention.

The present invention also provides a method for aligning an image at a desired position relative to a substrate support and a method for treating a substrate. The method includes the step of providing a radiation source producing desired wavelengths of radiation. Such radiation sources include mercury and xenon-mercury arc lamps. Such lamps are available from Hanova, ORC and ARC. However, any radiation source may be employed which produces a spectrum of wavelengths and range of power output which are sufficient to cause the desired reaction in the photosensitive material applied to the substrate. However, any radiation may be used in processing photosensitive materials typically coated on substrates for forming electronic devices, such as circuit boards and cards, among others.

The wavelengths produced by the radiation source may also vary, depending upon the requirements of the process. In one particular embodiment, the radiation source produces at least part of its spectrum of radiation about 365 nm. However, any wavelength may be produced by the radiation source.

The method also includes directing radiation produced by the radiation source toward a substrate support. The radiation may pass directly from the radiation source to the substrate support without being reflected or otherwise altered from its path other than as described below. Alternatively, the method of the invention may include positioning one or more reflecting surfaces, such as a mirror, between the radiation source and the substrate support such that the radiation is directed from the radiation source to the one or more reflecting surfaces and finally to the substrate support.

At least one filter 25 may be positioned in the path of the radiation between the radiation source 1 and the substrate support 3. As described above, the at least one filter functions at least in helping to align the radiation source, mask, and substrate support. The at least one filter 25 may filter out any desired wavelength produced by the radiation source 1. For instance, in one embodiment, the radiation source produces ultraviolet light as well as visible light. The at least one filter 25 filters out the visible light, allowing the ultraviolet light to be transmitted to the substrate support. In other embodiments, other portions of the spectrum of radiation produced by the radiation source may be filtered out of the radiation prior to the impact of the radiation upon the radiation upon a substrate support.

A method of the present invention of aligning a mask for a UV projection exposure system preferably also includes a step of positioning a mask 5 between the radiation source 1 and the substrate support 3. The mask 5 preferably is opaque to the wavelengths of radiation causing photochemical reactions to occur in the photosensitive material of a substrate or applied to a substrate. A pattern is formed in the mask to selectively transmit the radiation to the substrate support 3. The mask 5 may be positioned at any location between the substrate support 3 and the radiation source 1 and also in any position relative to the filter 25.

Prior to irradiating the substrate support, at least one sensor or detector is positioned so as to sense or detect radiation impacting upon the substrate support 3. The sensor may be positioned as in the embodiments shown in FIGS. 1 and 2, alternatively, the sensor may be on or within the substrate support. The sensor may be sensitive to wavelengths of radiation produced by the radiation source or to other wavelengths, as described below in conjunction with the step of providing a fluorescing substance. The detectors may be selected from any one of the detectors described above in the description of the apparatus of the present invention or any other detector for detecting a desired wavelength. Such detectors are well known to those skilled in the art.

After positioning the at least one filter 25, the mask 3, and the at least one sensor or detector, the substrate support 3 may be irradiated with radiation from the radiation source 1. The radiation preferably passes through the filter and the mask thereby producing a pattern of radiation on the substrate support 3. The pattern formed on the substrate support preferably corresponds to the pattern formed in the mask.

Upon the impact of the radiation upon a substrate support, the position of the pattern of radiation formed on a substrate support preferably is detected by the at least one sensor or detector. The sensed position of the pattern may then be compared to a desired position.

In comparing the sensed position to the desired position, upon determining the position of the pattern of radiation formed on the substrate support, a method according to the present invention may include the step of the production by the sensor or detector of a signal corresponding to the sensed position. A processor may be provided which compares the sensed position of the radiation pattern with the desired position of the radiation pattern to determine whether a deviation of the sensed pattern away from the desired position exists. After being sensed, the signal corresponding to the sensed position may then be sent to the processor.

According to the method of the invention, a desired position of the projected image preferably has been previously stored in the memory of the processor. Therefore, after receiving the signal corresponding to the sensed position, the processor may then compare the sensed position of the radiation pattern with the desired position to determine whether a deviation of the sensed pattern away from the desired position exists.

If a deviation between sensed and desired positions exists, the invention may include the step of altering the position of the radiation source, mask, and substrate support relative to each other so as to cause the sensed position to substantially correspond to the desired position. The alternation of the position may be caused by activating motors which alter the position of the substrate support 3.

A method of aligning a mask according to the present invention may also include the step of positioning at least one lens between the radiation source 1 and the substrate support 3. The at least one lens may be positioned anywhere between the radiation source and the substrate support. Additionally, the at least one lens may also be of any type. For instance, the lens may be one or more condensing lenses. Alternatively, the method may include positioning one or more projecting lenses instead of or in addition to one or more condensing lenses. The at least one lens may alter the path of the radiation in any manner. For instance, the lens may help to focus the radiation on the mask and/or the substrate support.

The embodiment shown in FIG. 2 includes a condenser lens placed between the filter and the radiation source and a projection lens positioned between the mask and the substrate support. However, any number of lenses may be placed between the radiation source and the substrate support to produce any desired effect. The lenses should be placed between the radiation source and the substrate support prior to irradiating the substrate support with radiation.

The method of aligning a mask may also comprise the step of providing a fluorescing medium on the substrate support 3. The fluorescing medium may fluoresce upon a radiation by any wavelength of radiation. For instance, the fluorescing medium may fluoresce in response to wavelengths of ultraviolet radiation typically used to treat photosensitive materials typically employed in forming electronic devices.

The ultraviolet radiation may be near UV or deep UV or anywhere in between. Other wavelengths of radiation may also be used to cause the fluorescing medium to fluoresce and/or to treat the photosensitive material on the substrate. The fluorescing medium preferably assists in aligning the substrate support, mask and radiation source relative to each to ensure the proper positioning of the radiation produced by the radiation source 1 upon the substrate support 3.

Preferably, the radiation produced by the fluorescing medium as it is irradiated it is detectable by the at least one detector positioned to detect the position of the radiation on the substrate support. In a preferred embodiment, the fluorescing medium produces wavelengths of visible radiation in response to being irradiated by ultraviolet radiation. The position of the fluorescing pattern formed by irradiation of the substrate support may then be compared to the desired position as described above.

The present invention also includes a method of treating a substrate with radiation. The method includes the steps of providing a radiation source producing desired wavelengths of radiation. Such radiation sources include mercury and xenon-mercury arc lamps. Such lamps are available from Hanova, ORC and ARC. However, any radiation source may be employed which produces a spectrum of wavelengths and range of power output which are sufficient to cause the desired reaction in the photosensitive material applied to the substrate. However, any radiation may be used in processing photosensitive materials typically coated on substrates for forming electronic devices, such as circuit boards and cards, among others.

The wavelengths produced by the radiation source may also vary, depending upon the requirements of the process. In one particular embodiment, the radiation source produces at least part of its spectrum of radiation about 365 nm. However, any wavelength may be produced by the radiation source employed with the invention.

The method also includes directing radiation produced by the radiation source toward a substrate support. The radiation may pass directly from the radiation source to the substrate support without being reflected or otherwise altered from its path other than as described below. Alternatively, the method of the invention may include positioning one or more reflecting surfaces, such as a mirror, between the radiation source and the substrate support such that the radiation is directed from the radiation source to the one or more reflecting surfaces and finally to the substrate support.

At least one filter 25 may be positioned in the path of the radiation between the radiation source 1 and the substrate support 3. As described above, the at least one filter functions at least in helping to align the radiation source, mask, and substrate support. The at least one filter 25 may filter out any desired wavelength produced by the radiation source 1. For instance, in one embodiment, the radiation source produces ultraviolet light as well as visible light. The at least one filter 25 filters out the visible light, allowing the ultraviolet light to be transmitted to the substrate support. In other embodiments, other portions of the spectrum of radiation produced by the radiation source may be filtered out of the radiation prior to the impact of the radiation upon the radiation upon a substrate support.

A method of the present invention of aligning a mask for a UV projection exposure system preferably also includes a step of positioning a mask 5 between the radiation source 1 and the substrate support 3. The mask 5 preferably is opaque to the wavelengths of radiation causing photochemical reactions to occur in the photosensitive material of a substrate or applied to a substrate. A pattern is formed in the mask to selectively transmit the radiation to the substrate support 3. The mask 5 may be positioned at any location between the substrate support 3 and the radiation source 1 and also in any position relative to the filter 25.

Prior to irradiating the substrate support, at least one sensor or detector is positioned so as to sense or detect radiation impacting upon the substrate support 3. The sensor may be positioned as in the embodiments shown in FIGS. 1 and 2, alternatively, the sensor may be on or within the substrate support. The sensor may be sensitive to wavelengths of radiation produced by the radiation source or to other wavelengths, as described below in conjunction with the step of providing a fluorescing substance. The detectors may be selected from any one of the detectors described above in the description of the apparatus of the present invention or any other detector for detecting a desired wavelength. Such detectors are well known to those skilled in the art.

After positioning the at least one filter 25, the mask 3, and the at least one sensor or detector, the substrate support 3 may be irradiated with radiation from the radiation source 1. The radiation preferably passes through the filter and the mask thereby producing a pattern of radiation on the substrate support 3. The pattern formed on the substrate support preferably corresponds to the pattern formed in the mask.

Upon the impact of the radiation upon a substrate support, the position of the pattern of radiation formed on a substrate support preferably is detected by the at least one sensor or detector. The sensed position of the pattern may then be compared to a desired position.

In comparing the sensed position to the desired position, upon determining the position of the pattern of radiation formed on the substrate support, a method according to the present invention may include the step of the production by the sensor or detector of a signal corresponding to the sensed position. A processor may be provided which compares the sensed position of the radiation pattern with the desired position of the radiation pattern to determine whether a deviation of the sensed pattern away from the desired position exists. After being sensed, the signal corresponding to the sensed position may then be sent to the processor.

According to the method of the invention, a desired position of the projected image preferably has been previously stored in the memory of the processor. Therefore, after receiving the signal corresponding to the sensed position, the processor may then compare the sensed position of the radiation pattern with the desired position to determine whether a deviation of the sensed pattern away from the desired position exists.

If a deviation between sensed and desired positions exists, the invention may include the step of altering the position of the radiation source, mask, and substrate support relative to each other so as to cause the sensed position to substantially correspond to the desired position. The alternation of the position may be caused by activating motors which alter the position of the substrate support 3.

A method of aligning a mask according to the present invention may also include the step of positioning at least one lens between the radiation source 1 and the substrate support 3. The at least one lens may be positioned anywhere between the radiation source and the substrate support. Additionally, the at least one lens may also be of any type. For instance, the lens may be one or more condensing lenses. Alternatively, the method may include positioning one or more projecting lenses instead of or in addition to one or more condensing lenses. The at least one lens may alter the path of the radiation in any manner. For instance, the lens may help to focus the radiation on the mask and/or the substrate support.

The embodiment shown in FIG. 2 includes a condenser lens placed between the filter and the radiation source and a projection lens positioned between the mask and the substrate support. However, any number of lenses may be placed between the radiation source and the substrate support to produce any desired effect. The lenses should be placed between the radiation source and the substrate support prior to irradiating the substrate support with radiation.

The method of aligning a mask may also comprise the step of providing a fluorescing medium on the substrate support 3. The fluorescing medium may fluoresce upon a radiation by any wavelength of radiation. For instance, the fluorescing medium may fluoresce in response to wavelengths of ultraviolet radiation typically used to treat photosensitive materials typically employed in forming electronic devices. The ultraviolet radiation may be near UV or deep UV or anywhere in between. Other wavelengths of radiation may also be used to cause the fluorescing medium to fluoresce and/or to treat the photosensitive material on the substrate. The fluorescing medium preferably assists in aligning the substrate support, mask and radiation source relative to each to ensure the proper positioning of the radiation produced by the radiation source 1 upon the substrate support 3.

Preferably, the radiation produced by the fluorescing medium as it is irradiated is detectable by the at least one detector positioned to detect the position of the radiation on the substrate support. In a preferred embodiment, the fluorescing medium produces wavelengths of visible radiation in response to being irradiated by ultraviolet radiation. The position of the fluorescing pattern formed by irradiation of the substrate support may then be compared to the desired position of the radiation on the substrate as described above.

After positioning the substrate support 3 in the proper position, a substrate 4 may be positioned on a substrate support. After positioning the substrate on the substrate support, according to a method of the present invention for treating a substrate, the substrate may be irradiated by the radiation source.

In this disclosure, there is shown and described only the preferred embodiments of the invention, but, as aforementioned it is to be understood that the invention is capable of use in various other combinations and environments and is capable of changes or modifications within the scope of the inventive concept as expressed herein.

What is claimed is:

1. An apparatus for aligning an image on a substrate support, said apparatus comprising:

a substrate support for supporting a substrate to be treated by radiation;

at least one radiation source for producing desired wavelengths of radiation to treat the substrate, said radiation being directed toward said substrate support;

at least one filter for filtering out selected wavelengths of said radiation, said filter being positioned between said substrate support and said radiation source;

a mask for selectively transmitting said radiation, said mask being positioned between said radiation source and said substrate support;

at least one detector for detecting a position of radiation impinging upon said substrate support and producing a signal corresponding to said sensed position;

means for comparing said detected position with a desired position of radiation impinging upon said substrate support, said comparing means receiving a signal from said at least one detector, comparing said detected position to said desired position, and producing a signal corresponding to said comparison; and means for positioning said substrate support in a desired position for treating the substrate, said positioning means receiving said signal from said comparing means and for altering when necessary in a direction parallel to a surface of a substrate supported by said substrate support the position of said substrate support and said radiation source, mask, and filter relative to each other in accordance with said signal so that said sensed position corresponds to said desired position.

2. An apparatus according to claim 1, further comprising:

at least one lens positioned between said mask and said substrate support.

3. An apparatus according to claim 2, wherein said at least one lens positioned between said radiation source and said mask is a condensing lens.

4. An apparatus according to claim 2, wherein said at least one filter is positioned between said mask and said at least one lens positioned between said radiation source and said mask.

5. An apparatus according to claim 2, further comprising:

at least one lens positioned between said radiation source and said mask.

6. An apparatus according to claim 5, wherein said at least one lens positioned between said radiation source and said mask is a projection lens.

7. An apparatus according to claim 2, further comprising:

at least one projection lens positioned between said mask and said substrate support.

8. An apparatus according to claim 1, wherein said at least one detector comprises a pair of cameras detecting wavelengths of radiation transmitted by said filter and impinging upon said substrate support.

9. An apparatus according to claim 1, further comprising:

a fluorescing medium at said substrate support where the substrate to be treated by said radiation will be positioned, said fluorescing medium fluorescing in response to irradiation by said wavelengths transmitted by said at least one filter, and wherein said at least one detector is a camera sensitive to wavelengths produced by said fluorescing medium.

10. An apparatus according to claim 1, wherein said radiation produced by said source includes ultraviolet and visible light wavelengths and said at least one filter is opaque to visible light wavelengths.

11. An apparatus according to claim 1, further comprising a shuttle for moving said at least one filter into and out of said radiation produced by said radiation source.

* * * * *